United States Patent
Zhang et al.

(10) Patent No.: US 7,033,189 B1
(45) Date of Patent: Apr. 25, 2006

(54) ELECTRICAL CONNECTOR WITH DETACHABLE PICK-UP DEVICE

(75) Inventors: Chi Zhang, Kunsan (CN); Ren-Chih Li, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/159,982

(22) Filed: Jun. 22, 2005

(30) Foreign Application Priority Data

Nov. 4, 2004 (CH) .................... 2004200809287 U

(51) Int. Cl.
*H01R 13/44* (2006.01)
(52) U.S. Cl. ...................................... 439/135; 439/940
(58) Field of Classification Search ................ 439/135, 439/940, 41
See application file for complete search history.

(56) References Cited

U.S. PATENT DOCUMENTS

| 4,396,245 | A | * | 8/1983 | Lane | 439/148 |
|---|---|---|---|---|---|
| 5,681,174 | A | * | 10/1997 | Correll et al. | 439/135 |
| 5,688,133 | A | | 11/1997 | Ikesugi et al. | |
| 6,019,617 | A | | 2/2000 | Liu et al. | |
| 6,439,901 | B1 | * | 8/2002 | Ji et al. | 439/135 |

* cited by examiner

*Primary Examiner*—Tho D. Ta
(74) *Attorney, Agent, or Firm*—Wei Te Chung

(57) ABSTRACT

An electrical connector (100) includes an insulative housing (1) formed with a mating slot (12) and defining a mating direction; a plurality of terminals (2) loaded in the housing, each terminal provided with a resilient contact portion (21) protruding into the mating slot, the contact portion enabled to deflect along a direction substantially perpendicular to the mating direction; and a pick-up device (4) having a main body (41) with a smooth upper surface (411) for vacuum section and a retaining portion (42) extending down from the main body and inserted into the mating slot. The retaining portion is provided with a nose (423) pushed through the contact portions to engage with the contact portions along the mating direction.

12 Claims, 6 Drawing Sheets

ELECTRICAL CONNECTOR WITH DETACHABLE PICK-UP DEVICE

BACKGROUND OF THE INVENTION

1. Field of the Invention

The present invention relates to an electrical connector, and more particularly to an electrical connector having a detachable pick-up cap.

2. Description of Related Art

Electrical connectors including pick-up means for facilitating picking up and positioning by a pick-up machine such as a vacuum suction nozzle or the like are well-known. For example, U.S. Pat. No. 5,688,133 discloses such a connector with a pick-up cap. The pick-up cap comprises a flat cover plate and pairs of resilient legs descending downwardly from edges of the cover plate to engage sidewalls of the connector. The legs include main legs gripping outside of the sidewalls and auxiliary legs abutting against inner surfaces of the sidewalls. With this arrangement, each sidewall of the connector is, in effect, sandwiched between the main and auxiliary legs to be picked up via the force applied thereto by the legs while the pick-up cap is taken up by suction of a vacuum suction nozzle upon the flat cover plate thereof. Then the connector is transferred to a printed circuit board (PCB) and positioning them in a preselected position for soldering. The pick-up cap remains in place upon the connector until after it is joined to the PCB by soldering. So, the sidewalls of the connector are under the gripping force applied by the legs of the pick-up cap all the while during passing through the reflow vessel for soldering. As the auxiliary legs punched out of the main legs are shorter than the main legs, the auxiliary legs and the main legs respectively abut against the sidewalls on their upper portions and lower portions. As a result, the main legs press the sidewalls slightly inwardly while the auxiliary legs press the sidewalls slightly outwardly, which may cause deformation or warpage of the connector on the sidewalls. If once such deformation or warpage occur, it will potentially result in misalignment and misengagment between the connector and its mating connector.

U.S. Pat. No. 6,019,617 discloses another conventional connector with a pick-up cap. The pick-up cap disclosed therein has two pairs of resilient legs each provided with a hook-like end to be forced into channel formed in sidewall of the connector. In the process of the resilient legs being forced into the channel, the hook-like ends thereof apply a force to the sidewalls, but that force is in a longitudinal direction along the sidewalls and will rarely cause deformation of the connector. Once the legs detained in the channels, the pick-up cap will not apply force to the sidewalls anymore, except a hooking force upwardly along the sidewalls when the pick-up cap is taken up by suction of a vacuum suction nozzle and the connector is hooked up by the pick-up cap. Thus the connector will rarely suffer deformation or warpage while passing through the reflow vessel for soldering. However, this kind of pick-up cap requires channels to be defined in sidewalls of the connector for its legs with hook-like ends, which not only complicates the machining procedure of the connector but also weakens the sidewalls of the connector.

Therefore, to overcome the disadvantages of the prior arts, an improved connector with a pick-up cap is desired.

SUMMARY OF THE INVENTION

An object of the present invention is to provide a connector having a pick-up cap which farthest reduces the deformation in the connector while passing through a reflow vessel.

Another object of the present invention is to provide a connector with a pick-up cap, which is easy to produce and assemble.

In order to achieve above-mentioned objects, an electrical connector in accordance with a preferred embodiment of the present invention includes an housing formed with a mating slot and defining a mating direction; a plurality of terminals loaded in the housing, each terminal provided with a resilient contact portion protruding into the mating slot and enabled to deflect along a direction substantially perpendicular to the mating direction; and a pick-up device having a main body with a smooth upper surface for vacuum section and a retaining portion extending down from the main body and inserted into the mating slot. The retaining portion is provided with a nose pushed through the contact portions to engage with the contact portions along the mating direction.

Other objects, advantages and novel features of the present invention will become more apparent from the following detailed description of the present embodiment when taken in conjunction with the accompanying drawings.

DETAILED DESCRIPTION OF THE INVENTION

Figure 1:
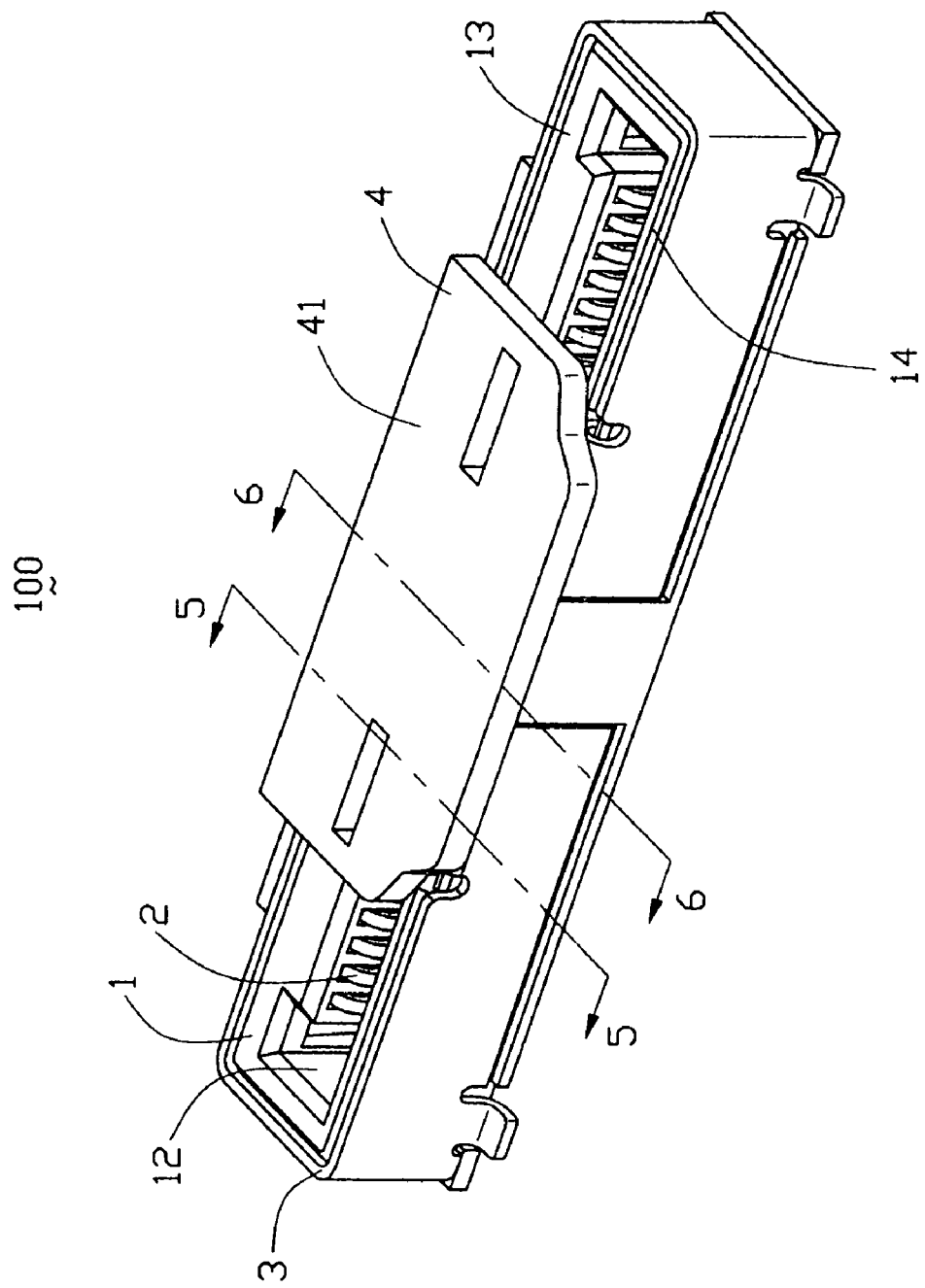
FIG. 1 is an assembled view of a connector with a pick-up cap in accordance with the preferred embodiment of the present invention.
Figure 2:
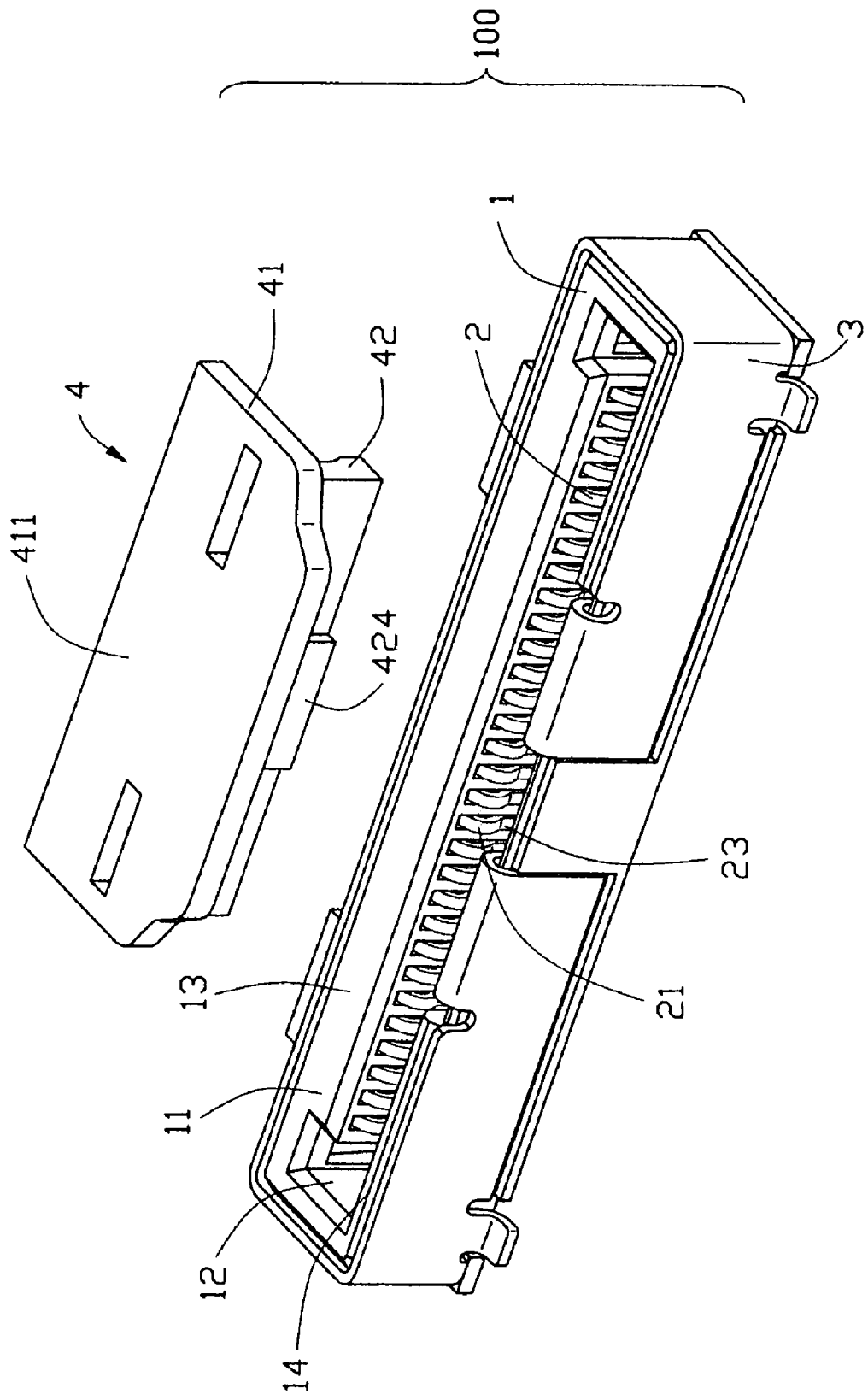
FIG. 2 is an exploded perspective view of the connector of FIG. 1.
Figure 3:
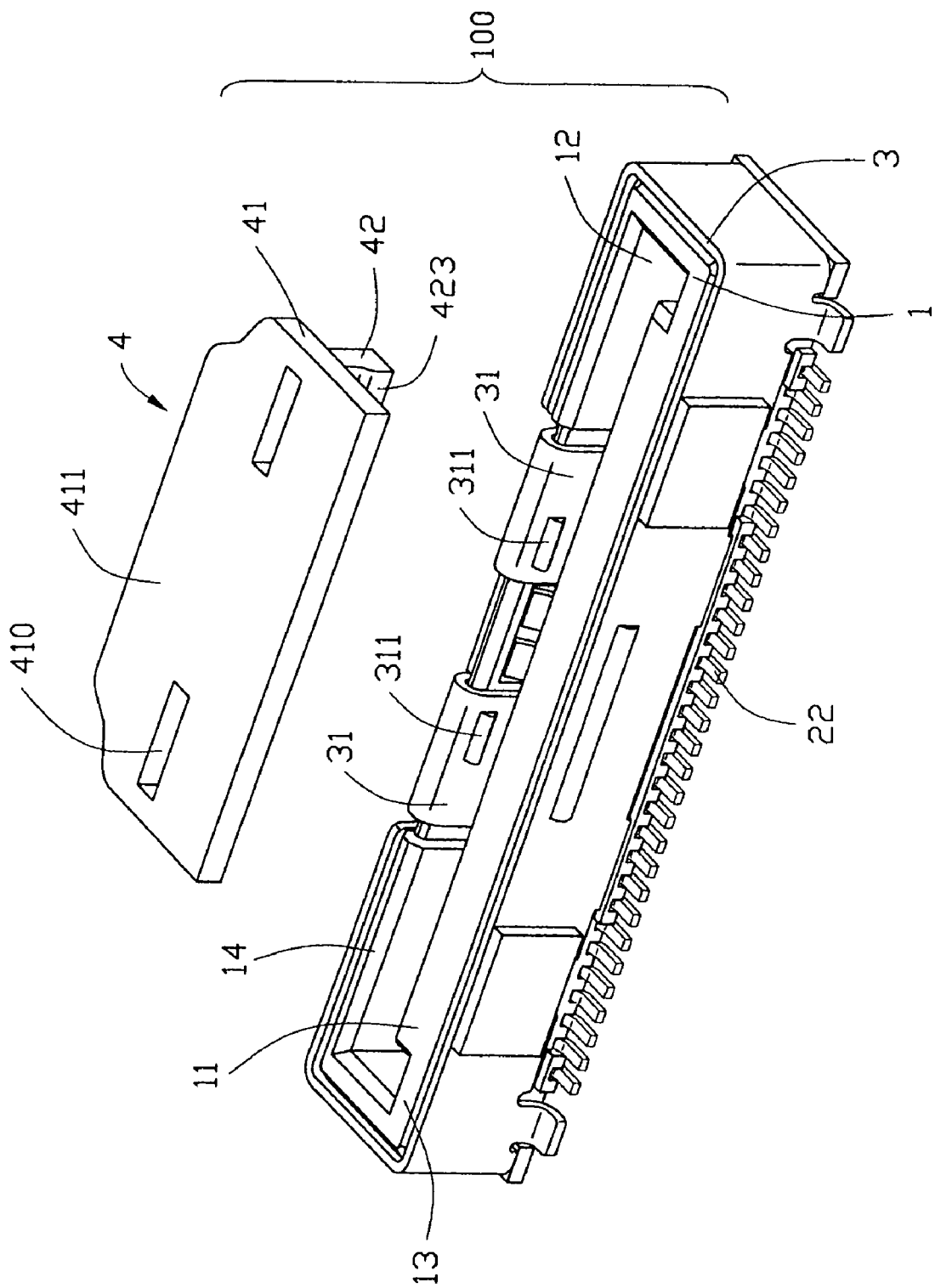
FIG. 3 is an exploded perspective view of the connector of FIG. 1 taken from another aspect.

Reference will now be made to the drawing figures to describe the preferred embodiment of the present invention in detail. Referring to FIGS. 1–3, a connector in accordance with the present invention comprises an insulative housing 1, a plurality of terminals 2 loaded in the housing 1, a shell 3 attached to a periphery of the housing 1, and a pick-up cap 4 detachably assembled to the housing 1.

Figure 5:
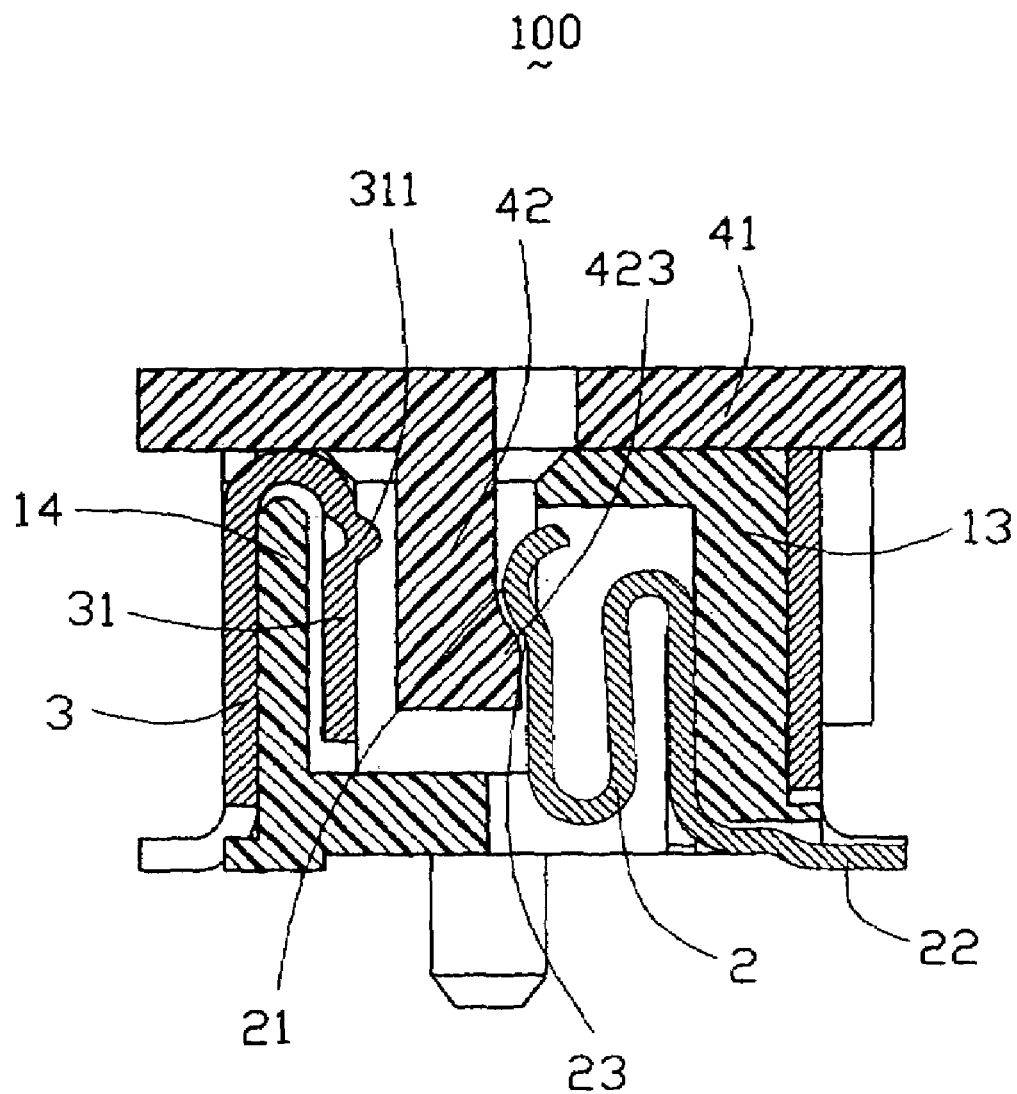
FIG. 5 is a cross-sectional view of the connector of FIG. 1 taken along line 5—5.

The housing 1 that is of a rectangular structure has a pair of opposite longitudinal sidewalls 13, 14 which define a slot 12 therebetween opening to a mating face 11 of the housing 1 to receive a mating connector. One of the sidewalls 13 defines a plurality of terminal-receiving grooves, each of which receives one terminal 2. The terminal 2 has a crooked head 21 protruding into the mating slot 12 to serve as a contact portion for electrically contacting a conductor on the mating connector and a tail 22 horizontally coming out of the housing 1 to serves as a solder portion to be soldered to a printed circuit board (PCB). Turning to FIG. 5, to join the crooked head 21 and the horizontally tail 22, the terminal 2 further has a S-shaped body portion (not labeled), which enable the contact portion 21 to perform resilience in a breadth direction. The crooked head 21 gives a lower section 23 of the terminal 2 closely extending therefrom, that is a joint of the crooked head 21 and the body portion, a concavity appearance.

Referring to FIG. 3, the shell 3 attached on the periphery of the housing 1 has a pair of stooped pieces 31 bent down onto an inner surface of the sidewall 14. That pair of pieces 31 are comparted by an inwardly bulged middle of the sidewall 14 in a longitudinal direction, and each has a rib 311 thereon protruding into the mating slot 12.

Figure 4:
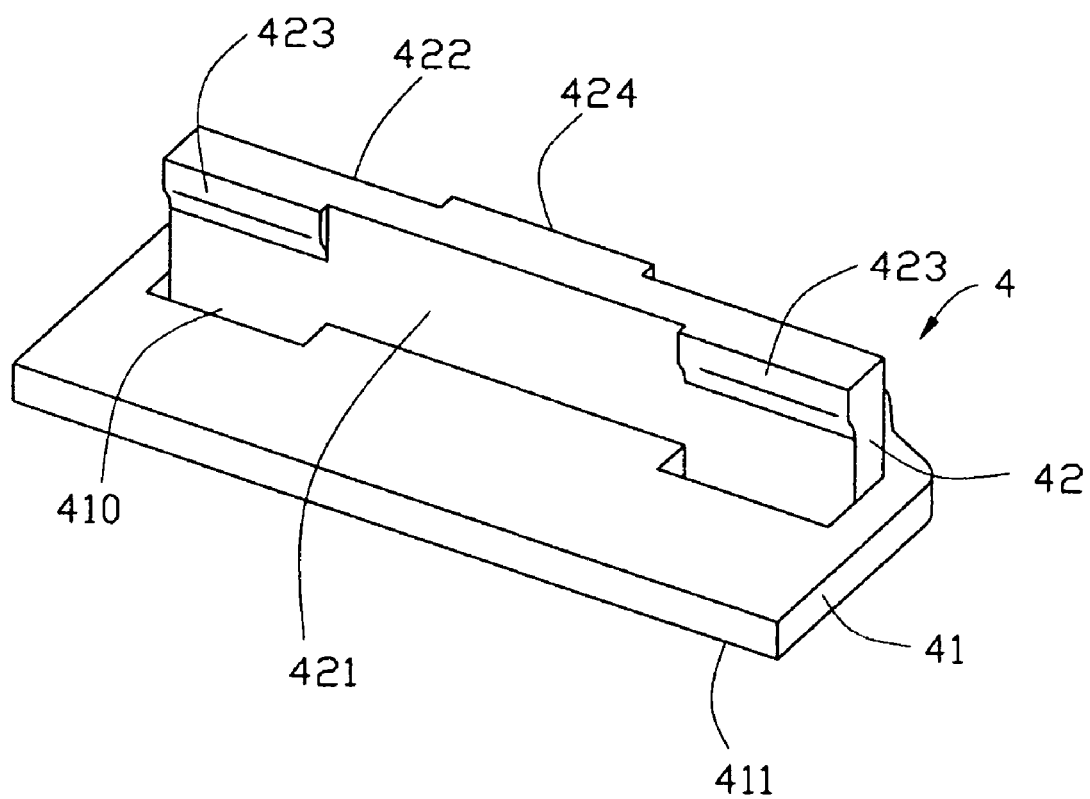
FIG. 4 is a perspective view of the pick-up cap of FIG. 1.

Referring to FIGS. 2–4, wherein FIG. 4 shows the pick-up cap 4 being inverted, the pick-up cap 4 comprises a flat cover plate 41 having a smooth upper surface 411 for receiving vacuum suction from a pick-up machine (not shown) and a retaining leg 42 extending downwardly from the cover plate 41 to be inserted into the mating slot 12 of the housing 1. From a first side 421 of the retaining leg 42 project a pair of rims 423 at its edge remote from the cover plate 41. Oppositely, there is a protuberant block 424 formed at the opposite second side 422 of the retaining leg 42 and extending from an end of the retaining plate 42 adjacent to the cover plate 41 to the other end remote from the cover plate 41. Wherein along a longitudinal direction of the retaining leg 42 corresponding to that of the elongated mating slot 12, the block 424 is located in middle of the pair of rims 423. Additionally, the cover plate 41 defines a pair of aperture 410 therethrough corresponding to the rims 423 for purpose of mold-pulling.

Figure 6:
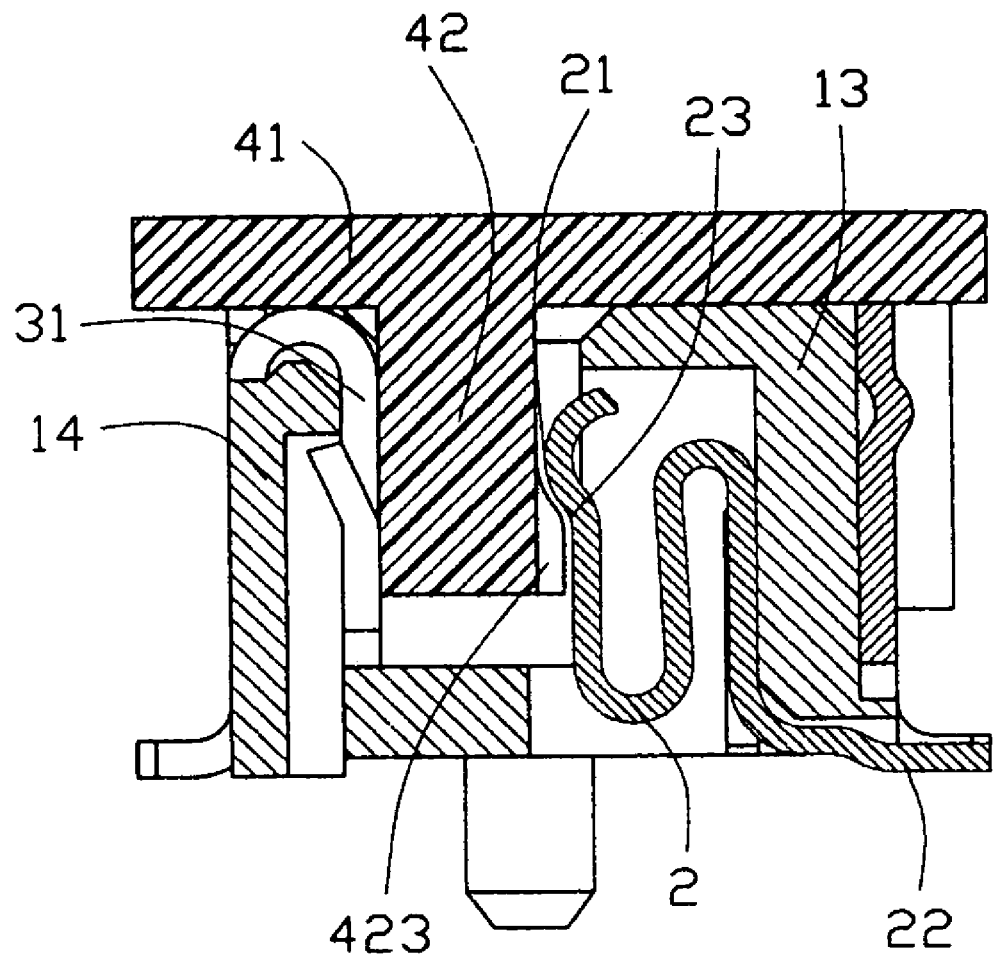
FIG. 6 is a cross-sectional view of the connector of FIG. 1 taken along line 6—6.

Referring to FIGS. 5 and 6 together, in use, the pick-up cap 4 is assembled to the housing 1 with the retaining leg 42 thereof inserted into the mating slot 12 and the cover plate 41 thereof covering upon the mating face 11. During the inserting process, the block 424 on the retaining leg 42 slides into the mating slot 12 from a gap between the pair of ribs 311 to be locked therebetween for preventing the pick-up cap 4 from longitudinally moving, and the rims 423 pushes through the contact portions 21 of the terminals 2 to be detained at the concavity 23 thereof. Thus, the connector 100 can be picked up via an upward force on the contact portions 21 applied by the rims 423 of the pick-up cap 4. The retaining leg 42 of the pick-up cap 4 is sized to being fitly received in the mating slot 12 but not inflicting a force onto the sidewalls 13, 14, that is to say, a maximal size of the retaining leg 42 in width is not larger than that of the mating slot 12. So, when the connector 100 is taken into a reflow vessel for soldering via the pick-up cap 4, the sidewalls 13, 14 will rarely suffer deformation or warpage.

The disclosure is illustrative only, changes may made in detail, especially in matter of shape, size, and arrangement of parts within the principles of the invention.

What is claimed is:

1. An electrical connector assembly comprising:
   an insulative housing formed with a mating slot and defining a mating direction;
   a plurality of terminals loaded in the housing, each terminal provided with a resilient contact portion protruding into the mating slot, the contact portion deflectable along a direction substantially perpendicular to the mating direction; and
   a pick-up device having a main body with a smooth upper surface for vacuum section and a retaining portion extending down from the main body and inserted into the mating slot, the retaining portion provided with a nose pushed trough the contact portions to engage with the contact portions along the mating direction,
   wherein the terminals are all arranged in one side of the mating slot.

2. The electrical connector assembly as described in claim 1, wherein a maximal size of the retaining portion in width is not larger than that of the mating slot.

3. The electrical connector assembly as described in claim 1, wherein the other side of the mating slot has a pair of protuberances thereon, and the retaining portion has a block received between the protuberances to prevent the pick-up device from moving along the mating slot.

4. The electrical connector assembly as described in claim 3, wherein the retaining portion defines a longitudinal direction corresponding to the mating slot, the block located in longitudinal middle of the retaining portion, and the nose separated into two parts respectively positioned at longitudinal ends of the retaining portion.

5. The electrical connector assembly as described in claim 4, wherein the block extends from the main body to an end edge of the retaining portion remote from the main body, and each one of the two parts of the nose is a rim by the end edge of the retaining portion.

6. The electrical connector assembly as described in claim 1, further comprising a shell attached on a periphery of the housing.

7. The electrical connector assembly as described in claim 6, wherein the shell has a pair of stooped pieces bent down onto an inner surface of the mating slot.

8. An electrical connector assembly comprising:
   an insulative housing defining along a longitudinal direction an elongated slot between opposite first and second longitudinal side walls thereof;
   a plurality of contacts disposed in the first longitudinal side wall of the housing by one side of said slot in a transverse direction perpendicular to said longitudinal direction, each of said contacts defining a flexible contact beam with a contact portion extending into the slot;
   an insulative pick-up cap defining a flat plate covering at least a portion of the slot in a vertical direction perpendicular to both said longitudinal direction and said transverse direction, at least one retaining leg downwardly extending from an underside of said flat plate and into the slot, a transversely protruding rim located around a first face of the retaining leg, confronting the contacts in the transverse direction and with the contact portion for holding the cap to the housing for preventing inadvertent upward movement of said cap along the vertical direction;
   a second face of said retaining leg being opposite to said first face, a first portion of said second face, which is located opposite to said rim, being spaced from the second longitudinal side wall of the housing with a large distance without engagement while a second portion of said second face, which is offset from said rim with a distance in said longitudinal direction, being spaced from the second longitudinal side wall of the housing with a small distance.

9. The electrical connector assembly as claimed in claim 8, wherein said flat plate defines an opening in alignment with said rim in the vertical direction.

10. The electrical connector assembly as claimed in claim 8, wherein a metallic shield essentially horizontally encloses exterior faces of the housing, said shield including an inner portion covering a portion of an interior face of the second side wall of the housing facing the slot, and wherein the first portion of the pick-up cap is spaced from said inner portion while said second portion of the pick-up cap is engaged with said inner portion.

11. An electrical connector assembly comprising:

an insulative housing defining along a longitudinal direction a longitudinal slot between opposite first and second longitudinal side walls thereof;

a plurality of contacts disposed in the first side wall of the housing with contact portions extending into the slot;

a metallic shield horizontally covering exterior faces of the housing and further including an inner portion covering a portion of an interior face of the second side wall of the housing facing the slot; and a pick-up cap defining a flat top plate covering at least a portion of the slot, a retaining leg downwardly extending from the flat top plate and into the slot; wherein said retaining leg defining first and second engagement portions respectively on opposite first and second faces thereof while being offset from each other in said longitudinal direction, said first engagement portion engaging the contact portions but not the inner portion of shield, and said second engagement portion engaging the inner portion of the shield but not the contact portion.

12. The electrical connector assembly as claimed in claim 11, wherein said flat plate defines an opening in alignment with the first engagement portion rim in a vertical direction.

* * * * *